United States Patent
Kawasumi

(10) Patent No.: US 8,988,920 B2
(45) Date of Patent: Mar. 24, 2015

(54) SEMICONDUCTOR MEMORY DEVICE

(75) Inventor: Atsushi Kawasumi, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 272 days.

(21) Appl. No.: 13/426,443

(22) Filed: Mar. 21, 2012

(65) Prior Publication Data

US 2013/0141959 A1     Jun. 6, 2013

(30) Foreign Application Priority Data

Dec. 1, 2011   (JP) ................................. 2011-263975

(51) Int. Cl.
    *G11C 5/06*       (2006.01)
    *G11C 7/12*       (2006.01)
    *G11C 7/18*       (2006.01)
    *G11C 11/419*     (2006.01)

(52) U.S. Cl.
    CPC .. *G11C 7/12* (2013.01); *G11C 7/18* (2013.01); *G11C 11/419* (2013.01)
    USPC ............... 365/72; 365/63; 365/154; 365/203; 365/207; 365/230.03

(58) Field of Classification Search
    CPC ...... G11C 29/80; G11C 29/81; G11C 29/787; G11C 7/12
    USPC ........... 365/51, 63, 203, 230.03, 72, 154, 207
    See application file for complete search history.

(56) References Cited

U.S. PATENT DOCUMENTS

| | | | |
|---|---|---|---|
| 6,345,010 B1 * | 2/2002 | Shimazaki et al. | 365/230.03 |
| 6,445,632 B2 * | 9/2002 | Sakamoto | 365/205 |
| 6,741,487 B2 | 5/2004 | Yokozeki | |
| 7,259,977 B2 | 8/2007 | Takeyama et al. | |
| 2011/0134678 A1 * | 6/2011 | Sato et al. | 365/63 |

FOREIGN PATENT DOCUMENTS

| | | |
|---|---|---|
| JP | S63-244392 | 10/1988 |
| JP | H11-191291 | 7/1999 |
| JP | 2003-151280 | 5/2003 |
| JP | 2006-032577 | 2/2006 |
| JP | 2007-273007 | 10/2007 |

OTHER PUBLICATIONS

Japanese Office Action for corresponding Japanese Application No. 2011-263975, mailed Jun. 17, 2014, in 11 pages.
Japanese Office Action for corresponding Japanese Application No. 2011-263975, mailed Sep. 9, 2014, in 8 pages.

* cited by examiner

*Primary Examiner* — Thao H Bui
(74) *Attorney, Agent, or Firm* — Knobbe, Martens, Olson & Bear LLP

(57) ABSTRACT

A semiconductor memory device according to an embodiment comprises: a plurality of memory cells arranged in a first direction and a second direction; local bit lines connected to group of the memory cells; a global bit line to be commonly connected to a plurality of the local bit lines; and switch circuits connected between the local bit lines and the global bit line. The switch circuits connect the global bit line to one of the local bit lines, the one of the local bit lines being electrically connected to the memory cells of the group located at a position specified by select information of the first direction and the second direction.

9 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2011-263975, filed on Dec. 1, 2011, the entire contents of which are incorporated herein by reference.

FIELD

The embodiments described herein relate to a semiconductor memory device.

BACKGROUND

Description of the Related Art

In recent years, along with the spread of mobile terminal devices and so on, there are increasing demands to improve the degree of integration and lower the power consumption of semiconductor memory devices. In SRAM (Static Random Access Memory), the greater part of power consumption is occupied by charge/discharge of electric power due to cell current in bit lines having an extremely large capacitance, hence, particularly in the case of SRAM, it is desirable to reduce capacitance overall, including that of bit lines.

At the same time, a hierarchical bit line system is known as a technique to increase speed. The hierarchical bit line system is a system that provides to the bit lines a hierarchy of local bit lines and global bit lines, thereby achieving increased speed by lightening capacitance of the local bit lines. However, providing hierarchy to the bit lines is generally not a technique for lowering power consumption. This is because, even if capacitance of the local bit lines is reduced, capacitance of the global bit lines is large, hence total bit line capacitance is hardly reduced at all. It is thus required to achieve lowering of power consumption by further reduction of capacitance.

DETAILED DESCRIPTION

A semiconductor memory device according to an embodiment comprises a plurality of memory cells, local bit lines, a global bit line and switch circuits. The plurality of memory cells is arranged in a first direction and a second direction intersecting the first direction. The plurality of the memory cells is divided into a plurality of groups in the first direction. The local bit lines are connected to the plurality of memory cells by the group of memory cells. The global bit line is commonly connected to a plurality of the local bit lines arranged in the first direction. The switch circuits are connected between the local bit lines and the global bit line and each configured to selectively connect any of the local bit lines to the global bit line electrically. The switch circuits connect the global bit line to one of the local bit lines, the one of the local bit lines being electrically connected to the memory cells of the group located at a position specified by select information of the first direction and the second direction.

First Embodiment

Figure 1:
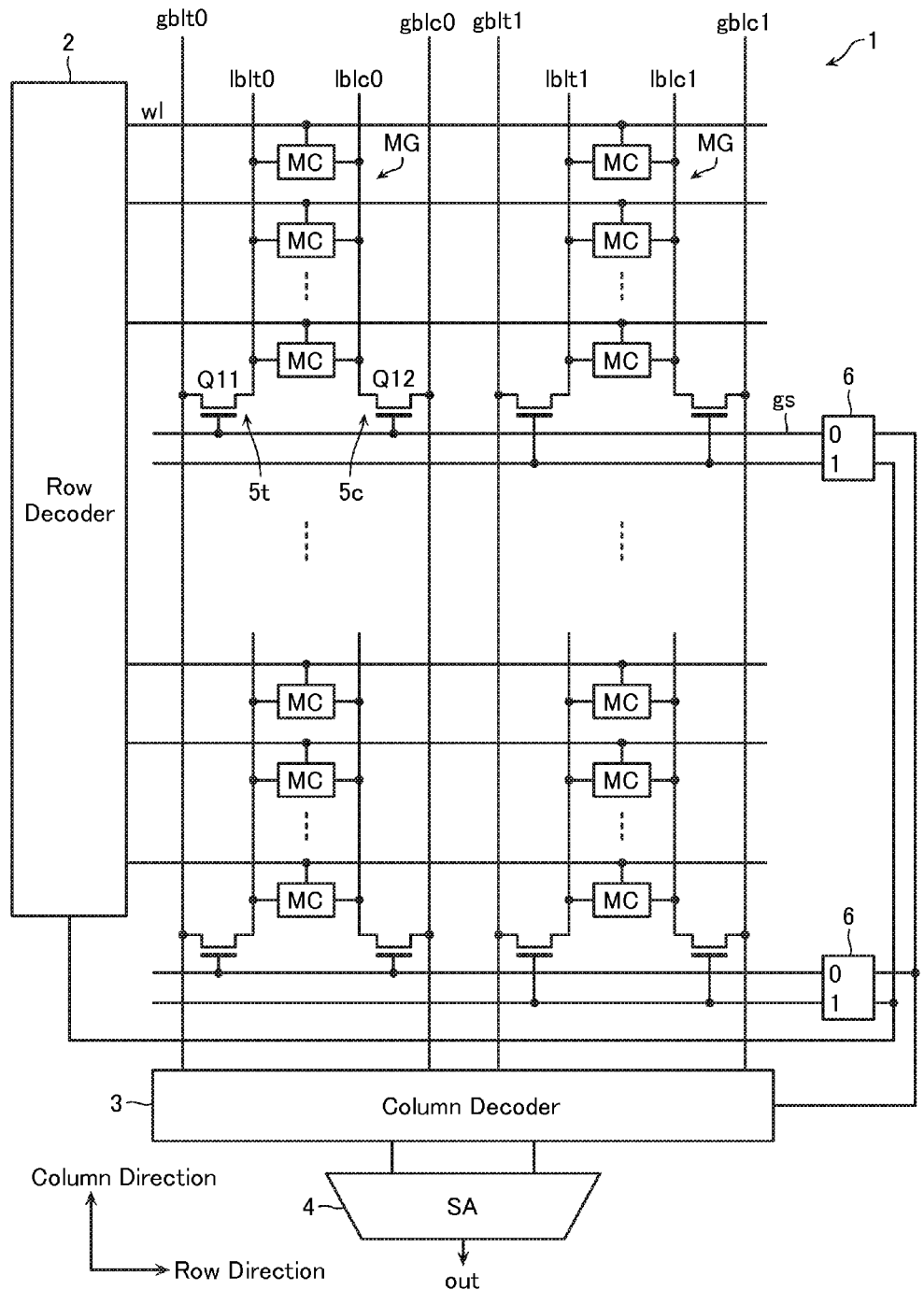
FIG. 1 is a block diagram showing a configuration of a semiconductor memory device according to a first embodiment.

FIG. 1 is a block diagram showing a configuration of a semiconductor memory device according to a first embodiment. This semiconductor memory device is configured as an SRAM and comprises a memory cell array 1 having memory cells MC disposed in a matrix in a row direction (first direction) and a column direction (second direction).

A plurality of memory cells MC arranged in the column direction are divided into groups of n (where n is an integer of two or more, and preferably a power-of-two), and the memory cells MC in each of memory groups configuring local memory groups MG are connected to a pair of local bit lines lblt and lblc that transfer mutually-inverted data. A plurality of the local bit lines lblt and lblc arranged in the column direction are connected, respectively, via switch circuits 5t and 5c, to global bit lines gblt and gblc extending in the column direction. In addition, each of the memory cells MC are connected also to a plurality of word lines wl orthogonal to the bit lines lblt, lblc, gblt, and gblc. Connected to the word lines wl is a row decoder 2 that selects the word lines wl based on a row address, and controls data write to the memory cells MC and data read from the memory cells MC. Moreover, the global bit lines gblt and gblc are connected to a column decoder 3 that selects the global bit lines gblt and gblc based on a column address, and controls data write to the memory cells MC and data read from the memory cells MC. The column decoder 3 connects selected global bit lines gblt and gblc to a sense amplifier 4. The sense amplifier 4 amplifies a differential of data of the selected global bit lines gblt and gblc and outputs this amplified differential as data out.

The switch circuit 5t comprises an NMOS transistor Q11 connected between the local bit line lblt and the global bit line gblt, and the switch circuit 5c comprises an NMOS transistor Q12 connected between the local bit line lblc and the global bit line gblc. Gates of the NMOS transistors Q11 and Q12 are controlled by a select circuit 6. The select circuit 6 is inputted with part of the row address outputted from the row decoder 2 and at least part of the column address outputted from the column decoder 3 to set to an on state only the NMOS transistors Q11 and Q12 connected to a memory group MG having a specified position in the column direction and the row direction.

Note that in FIG. 1, the column decoder 3 is configured to select either of two pairs of global bit lines gblt and gblc, but may of course be configured to select an even greater number of pairs of global bit lines gblt and gblc (preferably, a power-of-two).

Figure 2:
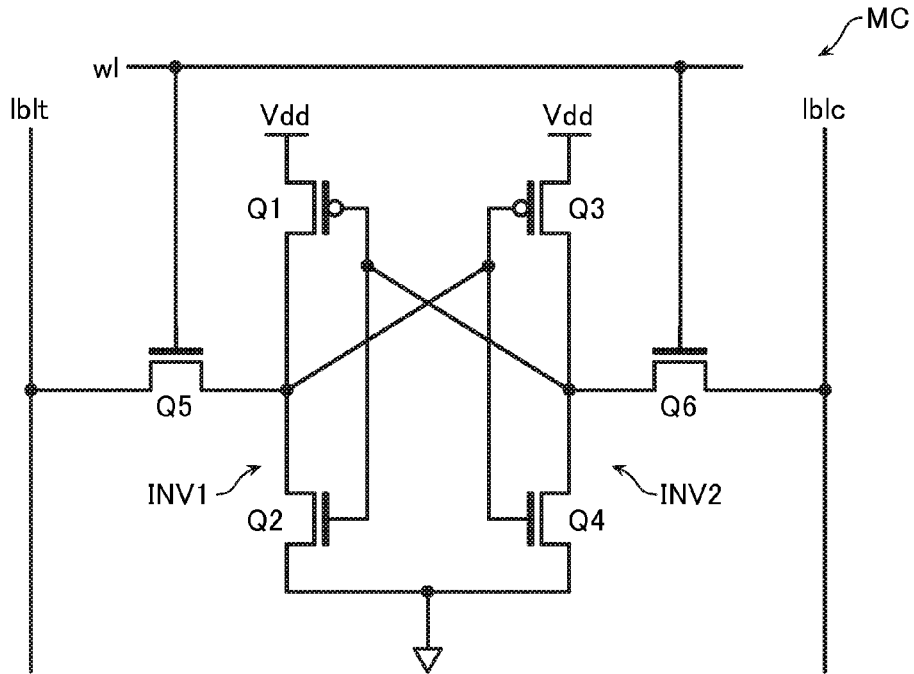
FIG. 2 is a circuit diagram showing a configuration of a memory cell in same semiconductor memory device.

FIG. 2 is a circuit diagram showing a configuration of the memory cell MC. The memory cell MC comprises: a first inverter INV1 configured by a PMOS transistor Q1 and an NMOS transistor Q2 that are complementary pair-connected between a power supply terminal Vdd and a ground terminal GND; and a second inverter INV2 configured by a PMOS transistor Q3 and an NMOS transistor Q4 that are complementary pair-connected between the power supply terminal Vdd and the ground terminal GND. An input terminal and output terminal of the first inverter INV1 are connected to, respectively, an output terminal and input terminal of the second inverter INV2. A data transfer NMOS transistor Q5 is connected between the output terminal of the first inverter INV1 and the local bit line lblt, and a data transfer NMOS transistor Q6 is connected between the output terminal of the second inverter INV2 and the local bit line lblc. The NMOS transistors Q5 and Q6 are driven and controlled by the word line wl.

Next, operation of the semiconductor memory device configured as above is described.

Figure 3:
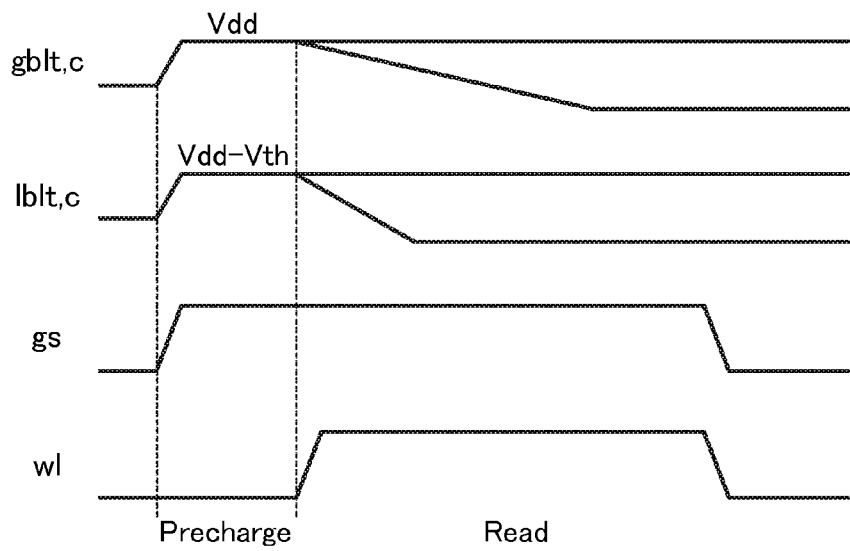
FIG. 3 is an operation waveform chart for during data read in same semiconductor memory device.

FIG. 3 is a waveform chart showing operation during data read. During read of data, first, a power supply voltage Vdd is applied to the global bit lines gblt and gblc. In this state, a group select signal gs which is a specific output of the select circuit 6 rises corresponding to the row address and column address. This causes the NMOS transistors Q11 and Q12 configuring the switch circuits 5t and 5c connected to the local bit lines lblt and lblc in the selected memory group MG to attain an on state, whereby the local bit lines lblt and lblc are pre-charged. At this time, a voltage of the local bit lines lblt and lblc lowers by an amount of a threshold voltage Vth of the NMOS transistors Q11 and Q12 to become Vdd-Vth. Next, when a voltage of the word line wl is raised, the transfer NMOS transistors Q5 and Q6 attain an on state, whereby the local bit lines lblt and lblc are driven according to data stored in the memory cell MC. As a result, the global bit lines gblt and gblc are also driven via the NMOS transistors Q11 and Q12. A level change of these global bit lines gblt and gblc is differentially amplified by the sense amplifier 4 to output data out.

Figure 4:
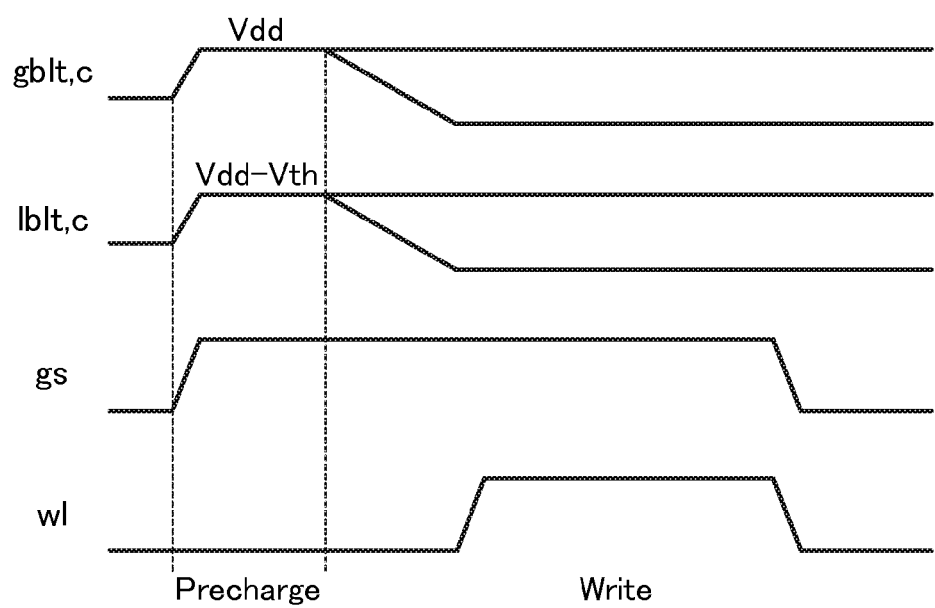
FIG. 4 is an operation waveform chart for during data write in same semiconductor memory device.

FIG. 4 is a waveform chart showing operation during data write. During write of data, similarly to during read of data, data is transferred to the global bit lines gblt and gblc after the local bit lines lblt and lblc have been pre-charged. This causes the data to be transferred also to the local bit lines lblt and lblc. Next, the voltage of the word line wl rises causing the transfer NMOS transistors Q5 and Q6 to attain an on state, whereby data of the local bit lines lblt and lblc is stored internally in the memory cell MC. If it is now assumed here that data transferred to the output terminal of the inverter INV1 is Vdd level, and data transferred to the output terminal of the inverter INV2 is 0 V, then, since the transfer transistors are the NMOS transistors Q5 and Q6, a voltage of a drain of the NMOS transistor Q2 to which Vdd is transferred rises only to Vdd-Vth. In contrast, a drain of the NMOS transistor Q4 to which 0 V is transferred falls to 0 V. As a result, the memory cell MC is mainly driven by the NMOS transistor Q6, and then driving of the PMOS transistor Q1 due to transfer 0 V by the NMOS transistor Q6 leads to a drain voltage of the NMOS transistor Q2 being raised to Vdd.

The present embodiment connects to the global bit lines gblt and gblc only the local bit lines lblt and lblc of a selected column direction and row direction, hence excess charge/discharge in unused global bit lines gblt and gblc does not occur, thus allowing power consumption overall to be reduced.

In addition, as mentioned above, in the memory cell MC using the NMOS transistors Q5 and Q6 as transfer transistors, transfer of 0 V outweighs transfer of Vdd. In the present embodiment, connection of the local bit lines lblt and lblc and the global bit lines gblt and gblc also uses the NMOS transistors Q11 and Q12, hence transfer of 0 V data from the global bit lines gblt and gblc to the memory cell MC can be performed smoothly with sufficient drive power.

In addition, in the case of reading or writing data via the local bit lines lblt and lblc, there are such problems as a mistaken read occurring when the local bit lines lblt and lblc are in a floating state. To solve this problem, it is conceivable to have the local bit lines lblt and lblc always connected to the global bit lines gblt and gblc electrically, and, during read and write, to leave connected only the local bit lines lblt and lblc subject to read and write, and set other switch circuits 5t and 5c to an off state. However, in this case, there is a problem that a large number of NMOS transistors Q11 and Q12 undergo transition from an on state to an off state, whereby power consumption increases.

Regarding this point, the present embodiment has a configuration in which the NMOS transistor configuring the switch circuits 5t and 5c is always in an off state, and, during read and write operations, only switch circuits 5t and 5c connected to a selected memory group MG become an on state, hence there is only one pair of NMOS transistors Q11 and Q12 that undergo transition during a read or write operation, thereby achieving a lowering of power consumption. That is the reason for adopting the configuration of pre-charging only the selected local bit lines lblt and lblc before read and write of data.

Second Embodiment

Figure 5:
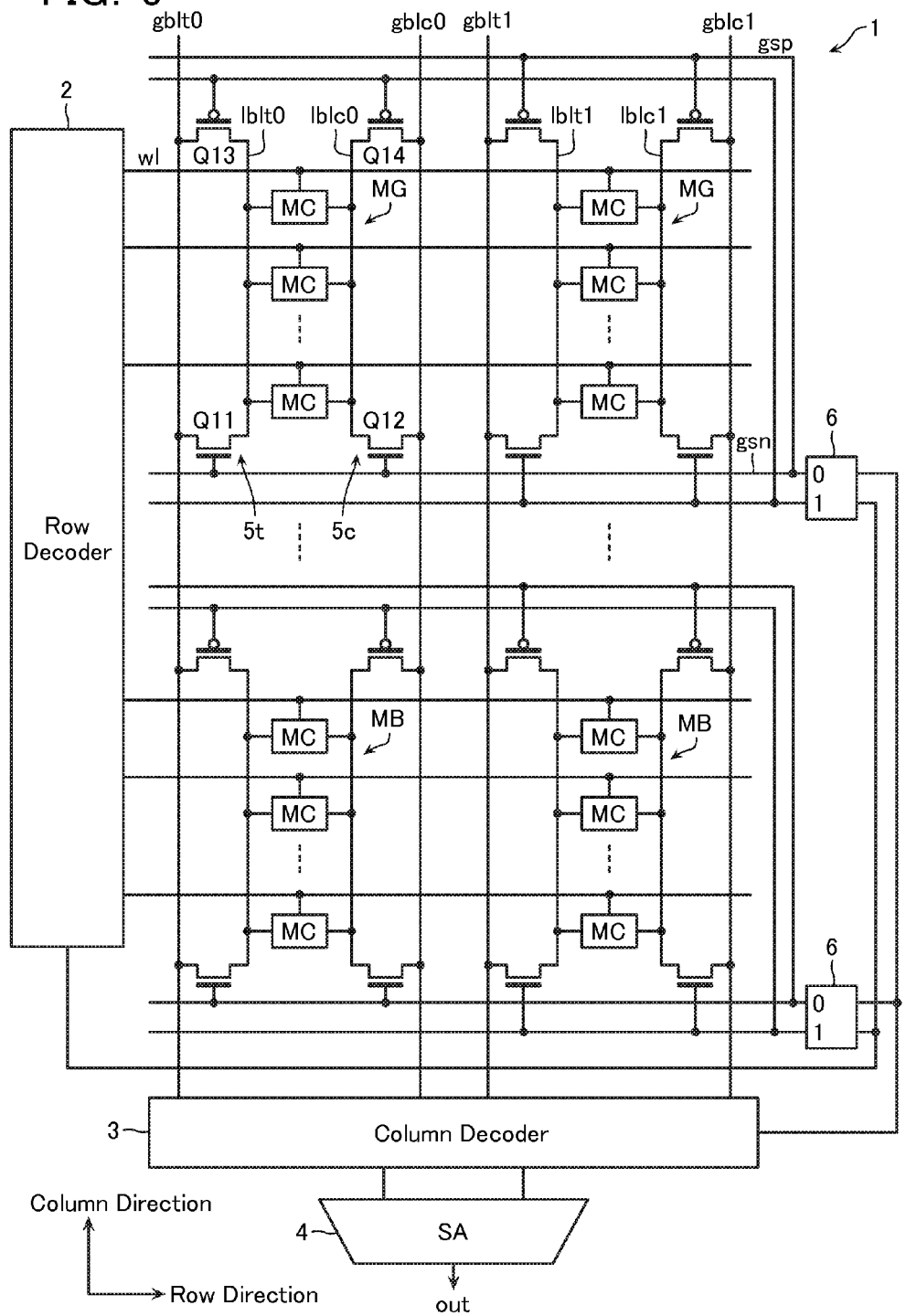
FIG. 5 is a block diagram showing a configuration of a semiconductor memory device according to a second embodiment.

FIG. 5 is a circuit diagram showing a configuration of a semiconductor memory device according to a second embodiment. In this embodiment, a configuration of switch circuits 15t and 15c connecting the local bit lines lblt and lblc and the global bit lines gblt and gblc differs from that of the switch circuits 5t and 5c in the first embodiment. The switch circuits 15t and 15c according to this second embodiment, in addition to including the NMOS transistors Q11 and Q12, include also PMOS transistors Q13 and Q14 connected in parallel to the NMOS transistors Q11 and Q12. Other configurations are similar to those in the previous embodiment, hence descriptions thereof are omitted.

Figure 6:
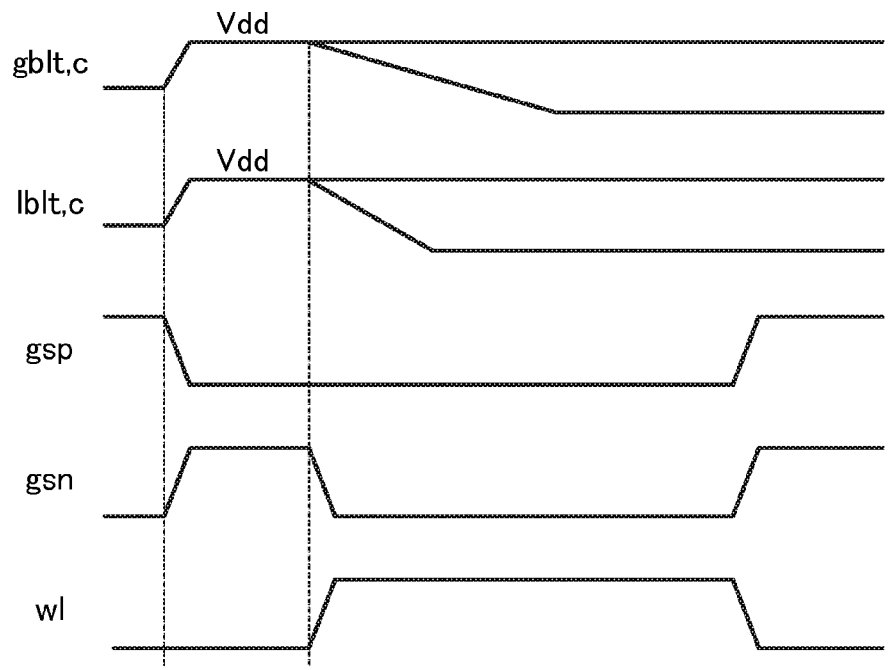
FIG. 6 is an operation waveform chart for during data read in same semiconductor memory device.

FIG. 6 is a waveform chart showing operation during data read. In this second embodiment, a pre-charge operation is performed by both the NMOS transistors Q11 and Q12 and the PMOS transistors Q13 and Q14, hence the local bit lines lblt and lblc are charged to Vdd at high speed. Setting the NMOS transistors Q11 and Q12 to an off state in the read period when the voltage of the word line wl is raised allows extreme over-swinging of amplitude of the global bit lines gblt and gblc to be suppressed.

Figure 7:
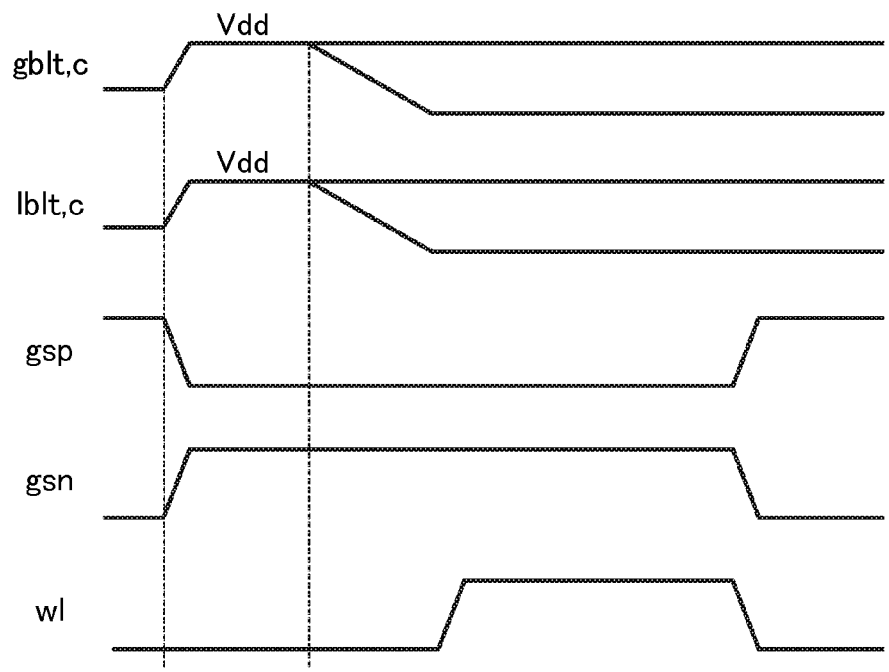
FIG. 7 is an operation waveform chart for during data write in same semiconductor memory device.

FIG. 7 is a waveform chart showing operation during data write. During data write, after pre-charging, both the NMOS transistors Q11 and Q12 and the PMOS transistors Q13 and Q14 are left set to an on state. This allows the write operation to be performed using also drive power of the NMOS transistors Q11 and Q12.

Third Embodiment

Figure 8:
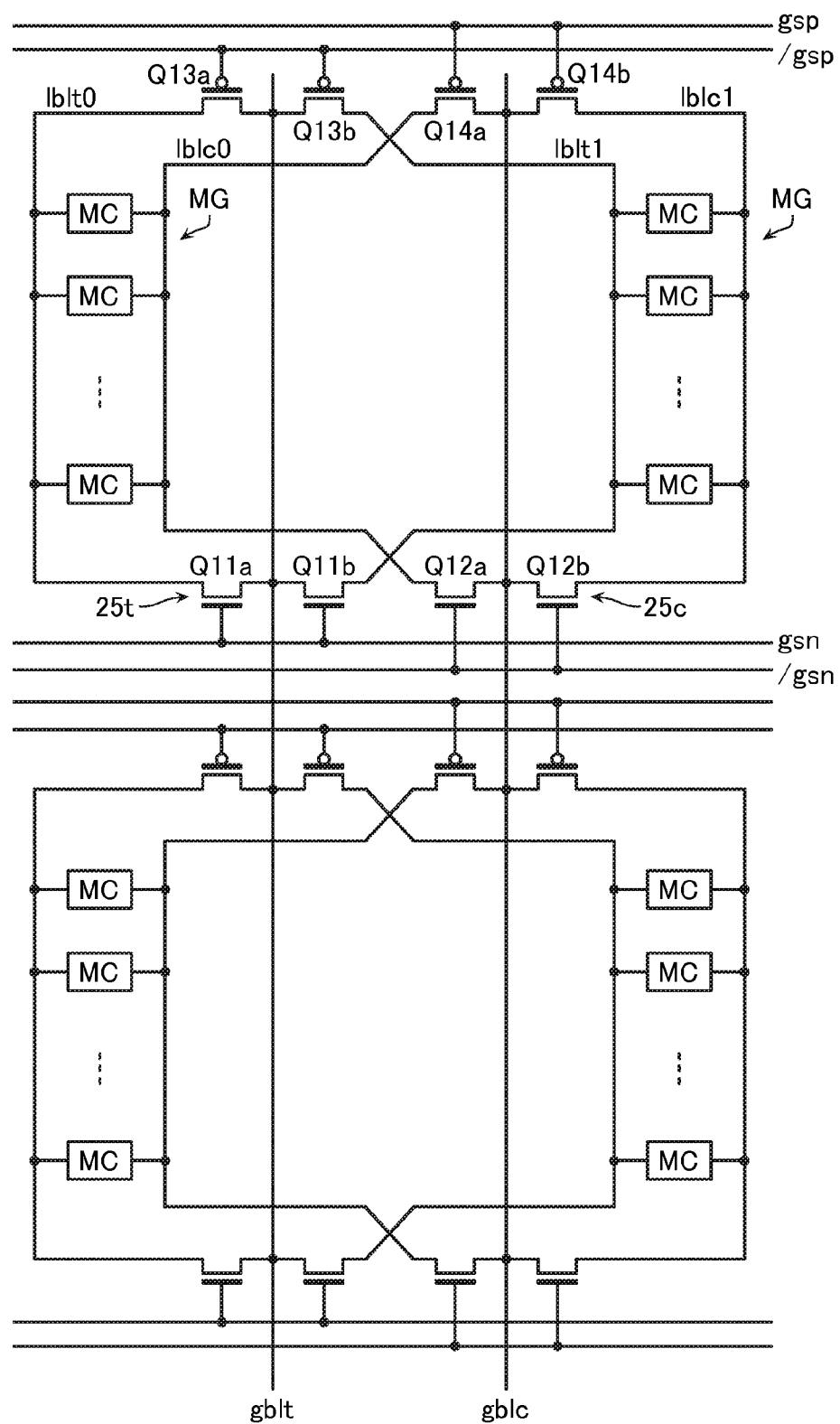
FIG. 8 is a block diagram showing a configuration of a semiconductor memory device according to a third embodiment.

FIG. 8 is a circuit diagram showing a configuration of a semiconductor memory device according to a third embodiment. In this embodiment, two-column's worth of local bit lines lblt and lblc are connected to one pair of global bit lines gblt and gblc. As a result, switch circuits 25t and 25c comprise: NMOS transistors Q11a and Q12a and PMOS transistors Q13a and Q14a that connect one memory group MG and the global bit lines gblt and gblc; and NMOS transistors Q11b and Q12b and PMOS transistors Q13b and Q14b that connect another memory group MG and the global bit lines gblt and gblc.

This embodiment allows pitch of the global bit lines gblt and gblc to be set to twice that of the previous embodiments, hence capacitance between adjacent global bit lines gblt and gblc can be reduced and a resultant lowering of power consumption can be achieved.

Note that in the above embodiments, it is desirable for sense timing by the sense amplifier 4 during the read operation to be designed to be performed after unselected local bit lines lblt and lblc connected to the memory cells MC connected to the same word line wl as the selected memory cell MC have undergone full swing. The reason is because it is only after the local bit lines have undergone full swing and cell current has ceased flowing that an effect of reducing power consumption is apparent.

Other

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of memory cells arranged in a first direction and a second direction intersecting the first direction, a plurality of the memory cells being divided into a plurality of groups in the first direction;
first and second local bit lines connected to the plurality of memory cells by the group of memory cells, the first and second local bit lines transfer mutually-inverted data;
a first and second global bit line to be commonly connected to a plurality of the first and the second local bit lines arranged in the first direction, the first and second global bit line transfer mutually-inverted data;
switch circuits respectively connected between the first or second local bit lines and the first or second global bit line and each configured to selectively connect any of the first or second local bit lines to the first or second global bit line electrically; and
a word line connected to the plurality of memory cells arranged in the second direction,
the memory cells respectively comprising:
a first inverter connected between a power supply terminal and a ground terminal;
a second inverter connected between the power supply terminal and the ground terminal, an input terminal and an output terminal of the first inverter being connected to, respectively, an output terminal and an input terminal of the second inverter; and
data transfer transistors,
the data transfer transistors being respectively connected between the output terminals of the first and second inverters and the first and second local bit lines,
gates of the data transfer transistors being connected to the word line,
the switch circuits each being configured by an NMOS transistor,
the switch circuits connecting the first or second global bit line to one of the first or second local bit lines, the one of the first or second local bit lines being electrically connected to the memory cells of the group located at a position specified by select information of the first direction and the second direction,
the NMOS transistor being set to an off state in an unselected state and, at a start time of a read operation, the NMOS transistor being set to an on state for pre-charging the first and second local bit lines connected to the memory cells of a selected group,
a plurality of the first and second local bit lines arranged in the second direction being respectively connected to the first and second global bit line via the switch circuits, and
a pitch of the first and second global bit line in the second direction is larger than a pitch of the first and second local bit lines.

2. The semiconductor memory device according to claim 1, wherein
the switch circuits each are configured by a PMOS transistor and the NMOS transistor connected between the first or second local bit lines and the first or second global bit line in parallel, the PMOS transistor and the NMOS transistor are set to the off state in the unselected state and, at the start time of the read operation, the PMOS transistor and the NMOS transistor are set to the on state for pre-charging the first and second local bit lines connected to the memory cells of the selected group.

3. The semiconductor memory device according to claim 2, wherein
in a read period when a voltage of the word line connected to the memory cells is raised, at least one of the PMOS transistor and the NMOS transistor is set to the off state.

4. The semiconductor memory device according to claim 2, wherein
during data write, after pre-charging, both the PMOS transistor and the NMOS transistor are left set to the on state.

5. The semiconductor memory device according to claim 1, further comprising:
a sense amplifier for amplifying a differential of voltage states of the first and second global bit line and outputting the amplified differential,
and wherein
after unselected local bit lines electrically connected to the memory cells connected to the same word line as a selected memory cell have undergone full swing, the read operation is performed by the sense amplifier.

6. A semiconductor memory device, comprising:
a plurality of memory cells arranged in a first direction and a second direction intersecting the first direction, a plurality of the memory cells being divided into a plurality of groups in the first direction;
first and second local bit lines connected to the plurality of memory cells by the group of memory cells, the first and the second local bit lines transfer mutually-inverted data;
a first and second global bit line to be commonly connected to a plurality of the first and second local bit lines arranged in the first direction, the first and the second global bit line transfer mutually-inverted data;
switch circuits respectively connected between the first or second local bit lines and the first or second global bit line and each configured to selectively connect any of the first or second local bit lines to the first or second global bit line electrically; and
a word line connected to the plurality of memory cells arranged in the second direction,
the memory cells respectively comprising:
a first inverter connected between a power supply terminal and a ground terminal;
a second inverter connected between the power supply terminal and the ground terminal, an input terminal and an output terminal of the first inverter being connected to, respectively, an output terminal and an input terminal of the second inverter; and data transfer transistors, the data transfer transistors being respectively connected between the output terminals of the first and second inverters and the first and second local bit lines, gates of the data transfer transistors being connected to the word line, the switch circuits each being configured by a PMOS transistor and an NMOS transistor connected between the first or second local bit lines and the first or second global bit line in parallel which are set to an off state in an unselected state and, at a start time of a read operation, are set to an on state for pre-charging the first and second local bit lines connected to the memory cells of a selected group, and the switch circuits connecting the first or second global bit line to one of the first or second local bit lines, the one of the first or second local bit lines being electrically connected to the memory cells of the group located at a position specified by select information of the first direction and the second direction, and in the period when a voltage of the word line connected to one of the memory cells is raised in the read operation, at least one of the PMOS transistor and the NMOS transistor is set to the off state.

7. The semiconductor memory device according to claim 6, wherein, at the start time of the read operation, the PMOS transistor and the NMOS transistor are set to the on state for pre-charging the first and second local bit lines connected to the memory cells of the selected group.

8. The semiconductor memory device according to claim 6, wherein a plurality of the first and second local bit lines arranged in the second direction are respectively connected to the first and second global bit line via the switch circuits.

9. The semiconductor memory device according to claim 6, wherein during data write, after pre-charging, both the PMOS transistor and the NMOS transistor are left set to the on state.

* * * * *